United States Patent [19]

Wong et al.

[11] Patent Number: 5,502,002
[45] Date of Patent: Mar. 26, 1996

[54] POLYIMIDE PASSIVATION OF GAAS MICROWAVE MONOLITHIC INTEGRATED CIRCUIT FLIP-CHIP

[75] Inventors: Wah-Sang Wong, Montebello; William D. Gray, Redondo Beach, both of Calif.

[73] Assignee: Hughes Aircraft Company, Los Angeles, Calif.

[21] Appl. No.: 317,983

[22] Filed: Oct. 4, 1994

Related U.S. Application Data

[63] Continuation of Ser. No. 886,567, May 21, 1992, abandoned.

[51] Int. Cl.$^6$ .......................... H01L 21/283; H01L 21/56
[52] U.S. Cl. .......................... 437/182; 437/184; 437/192
[58] Field of Search .......................... 437/182, 184, 437/192

[56] References Cited

U.S. PATENT DOCUMENTS

| | | | |
|---|---|---|---|
| 3,913,215 | 10/1975 | Heckl | 437/6 |
| 4,305,974 | 12/1981 | Abe et al. | 437/190 |
| 4,459,321 | 7/1984 | Kim | 427/63 |
| 4,859,633 | 8/1989 | Bayraktaroglu | 437/184 |
| 4,916,503 | 4/1990 | Uematsu et al. | 136/255 |
| 5,104,820 | 4/1992 | Go et al. | 437/208 |
| 5,179,041 | 1/1993 | Yano et al. | 437/192 |

FOREIGN PATENT DOCUMENTS

| | | | |
|---|---|---|---|
| 57-71139 | 5/1982 | Japan | 437/192 |
| 59-188127 | 10/1984 | Japan | 437/192 |
| 0320227 | 3/1984 | U.S.S.R. | 437/192 |

*Primary Examiner*—George Fourson
*Assistant Examiner*—David E. Graybill
*Attorney, Agent, or Firm*—M. E. Lachman; M. W. Sales; W. K. Denson-Low

[57] ABSTRACT

A process is provided for passivating surfaces (12') of III-V microwave monolithic integrated circuit (MMIC) flip chips (40). Essentially, two cured, patterned polyimide layers (10, 28) are applied, one on the chip surface supporting a gold-plated bridge (26) and passivating the surface and the other over the gold-plated bridge to passivate the bridge surface. Further, a silver-titanium composite layer (32) is deposited over a gold-plated bump-post (24), which is then covered by a silver-plated bump (38), in order to prevent scavenging of gold from the bump-post by a subsequent Pb-Sn reflow solder process used to mount the chip to a metallized ceramic substrate. The process of the invention facilitates a more compatible reflow solder silk-screening process with passivated III-V MMIC flip chips, resulting in a more uniform and consistent solder thickness and relieving a tight tolerance requirement on the plated silver bump height uniformity.

5 Claims, 3 Drawing Sheets

1

POLYIMIDE PASSIVATION OF GAAS MICROWAVE MONOLITHIC INTEGRATED CIRCUIT FLIP-CHIP

This is a continuation of application Ser. No. 886,567, filed May 21, 1992, abandoned.

BACKGROUND OF THE INVENTION

1. Field of the Invention

The present invention relates to the fabrication of III-V microwave monolithic integrated circuit (MMIC) flip chips, and, more particularly, to forming a passivation layer for protection of the surface of GaAs flip chips during assembly.

2. Description of Related Art

During the fabrication of GaAs MMIC flip chips, which are generally not fully passivated, several concerns arise. First, during chip assembly and handling, the gold-plated air bridges are susceptible to damage. Second, gold leaching (scavenging) and shorting of the gold interconnection circuitry occur as a result of contact with solder (lead-tin) on the chip surface during flip chip mounting onto a metallized ceramic substrate (LTCC - low temperature co-fired ceramic). Third, gold leaching occurs as a result of metallurgical interaction between lead-tin solder and gold-based, silver-plated flip chip bump. Fourth, chemical and mechanical effects to the circuit element occur as a result of the reflowed solder defluxing process.

In the reflowed solder defluxing process, chemical solvents are used to remove the flux material. If the MMIC flip chip is not fully passivated, some of the flux material may easily get trapped on some tight and small open areas, especially at locations under and around plated bridges, making removal of the flux material difficult.

An additional problem relates to the desire to facilitate a more compatible reflow solder silk-screening process with GaAs MMIC flip chips. The silk-screening process refers to the solder squeegee process across a metallized substrate onto a masked layer. Excess of solder is removed when the masking material is removed. The same technique may be applied to solder bump flip chip, in which case the bumps are formed by solder squeegee instead of plating, excess solder is removed when the bump photoresist is removed. The problem with this process is that a tight bump geometry tolerance cannot be utilized because of the nature of the process.

The prior art has not adequately addressed these concerns, particularly for GaAs-based devices, nor has the prior art adequately addressed flip chip assembly reliability.

Thus, a need remains to eliminate the several concerns mentioned above and provide a process that fully passivates GaAs MMIC flip chip surfaces.

SUMMARY OF THE INVENTION

In accordance with the invention, a process is provided for passivating GaAs MMIC flip chip surfaces. Essentially, the chip surface is passivated with a first polymeric film prior to the formation of the silver-plated bumps and the gold-plated bridges and then the plated bridges are passivated with a second polymeric film subsequent to their formation. Further, a composite layer including a layer of silver and a layer of titanium is formed over gold-plated bump-posts prior to forming the silver-plated bumps on the gold-plated bump-posts so as to prevent scavenging of gold from the bump-posts during the mounting process of the chip to the metallized ceramic substrate.

The process includes the steps of:

(a) providing the chip with completed devices thereon, including a patterned top metallization layer on a major surface thereof;

(b) forming a first polymeric layer on the major surface, which is patterned to expose bump-post sites and bridge post sites on the major surface;

(c) forming a first membrane layer of Au-Ti on the first polymeric layer and in the bump-post sites and the bridge post sites;

(d) forming the gold posts and the gold bridges in the bump-post sites and the bridge post sites, respectively;

(e) removing any portions of the Au-Ti membrane not covered by the gold posts and the gold bridges;

(f) forming a second polymeric layer on the major surface, which is patterned to expose the gold bump-posts;

(g) forming a second membrane layer of Ag-Ti on the second polymeric layer and on the gold bump-posts;

(h) patterning a bump photoresist layer over the second polymeric layer to expose the gold bump-posts;

(i) plating silver bumps on the gold bump-posts; and (j) removing the bump photoresist and any portions of the Ag-Ti membrane layer not covered by the silver bumps, thereby providing a final passivated flip chip.

The GaAs microwave monolithic integrated circuit chip so prepared has a first patterned polymeric layer formed on the major surface of the chip, a layer of Au-Ti between the gold-plated bump-post and the top metal layer on the surface of the chip and between the gold-plated bridge and the top metal layer, a second patterned polymeric layer formed on the first polymeric layer and over the gold-plated bridge, and a layer of Ag-Ti between the silver-plated bump and the gold-plated bump-post.

The process of the invention eliminates the concerns set forth above and facilitates a more compatible reflow solder silk-screening process with passivated GaAs MMIC flip chips, resulting in a more uniform and consistent solder thickness and relieving a tight tolerance requirement on the plated silver bump height uniformity. The process of the invention greatly improves GaAs flip chip assembly yield and also provides a substantial cost savings benefit on overall transmitter/receiver module manufacturing costs.

DESCRIPTION OF THE PREFERRED EMBODIMENTS

The following description is presented in terms of specific GaAs devices. However, it will be appreciated that the process of the invention is suitably employed in the processing of III-V devices in general.

GaAs microwave monolithic integrated circuits (MMICs) are processed to a point at which all required ion implantations have been done and activated, ohmic contacts have been formed to the implanted regions, FET gates have been formed and passivated with silicon nitride, circuit overlay has been metallized and passivated with silicon nitride, and top metallization has been patterned and metallized thereto.

That is, formation of the MMIC has been completed, and the wafer is ready for further processing.

Next, a first layer of polyimide passivation is applied to the top metal/GaAs surface and patterned. Gold-plated bridges and gold-plated bump-posts are then formed on the top metallization, and a second layer of polyimide passivation is then applied over the gold-plated bridges. Bump vias are patterned on top of the gold-plated bump-posts by a bump photoresist process. The gold-plated bump-posts are next plated up with silver to form the bumps. After forming the bumps, each MMIC device is separated from the others by scribe and break, and each device is flip-chip mounted on a metallized ceramic substrate, using a lead-tin (Pb-Sn) reflow soldering process. During the soldering process, the silver bumps are soldered to matching pads on the metallized ceramic substrate.

The polyimide passivation process on GaAs MMIC flip chip described herein provides a complete surface protection layer for the gold-based interconnection circuitry and the plated silver flip chip bumps. Additionally, this passivation layer serves as a mechanical protection of the chip surface from foreign material and damage to the interconnection circuitry during all phases of chip handling and flip chip mounting assembly.

Alternatively, other polymeric materials compatible with the MMIC process may be employed in place of polyimide to passivate GaAs. Examples of such other polymeric materials include polybenzyl methacrylate, polybutyl methacrylate, polybutyl styrene, polybutadiene, styrenes, polyamide resins, polyacrylics, polyacrylamides, polystyrenes, polyethylene, polyisoprene, polymethyl pentenes, polymethyl methacrylates, and polyvinyls. However, since polyimides are widely used in the semiconductor industry and are well-characterized, polyimides are preferably employed in the practice of the invention.

Figure 1:
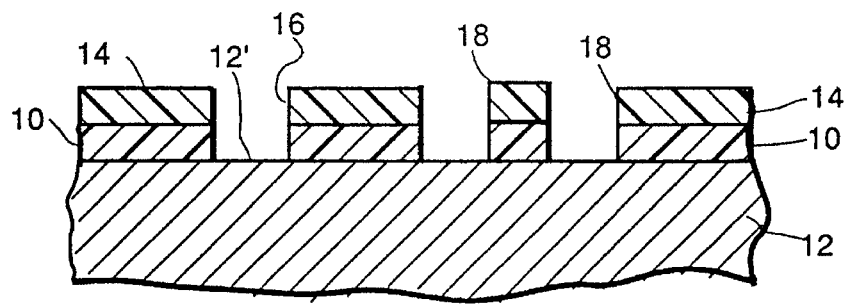
FIGS. 1–7, in cross-section, depict the sequence of a process according to the invention.

FIG. 1 depicts formation of a first polyimide layer 10 on the top metal surface and exposed portions of the GaAs surface in accordance with the invention; this composite surface is denoted 12' and is a major surface of the GaAs substrate 12. A first photoresist layer 14 is formed on top of the polyimide layer 10.

The first polyimide layer 10 is formed by spinning on, which is conveniently done, since this material in the uncured state is a viscous liquid. The spin-on technique for polyimide is well-known in the art, and involves spinning the wafer at a rate that depends on the viscosity of the particular polyimide used to obtain a layer of the desired thickness.

The first polyimide layer 10 is formed to a thickness ranging from 3 to 4 μm. This thickness is dictated by considerations related to RF performance in general and to shifting of RF frequency in particular.

The first photoresist layer 14, called the post photoresist layer, is for forming the sites for the gold-plated bump-posts and the gold-plated bridge posts, and is spun to a general thickness of about 4 μm, or thick enough to withstand the polyimide development process. This photoresist layer is conventional and is applied by photolithographic techniques well-known in the art. Following patterning and developing to form openings 16 for bump-post sites and openings 18 for bridge post sites, those portions of the underlying polyimide layer 10 exposed are removed by etching through to the underlying surface 12'. The structure at this stage in the processing is depicted in FIG. 1.

Next, the post photoresist layer 14 is removed, by conventional procedures, and the first polyimide layer 10 is fully cured, in order to convert it from a viscous liquid to a solid; this stabilizes the polyimide for subsequent processing steps. Curing is done employing a conventional ramping curing process. For example, the polyimide-coated wafer is placed in an air oven at room temperature, ramped up to 150° C. at 5°/min, held at 150° C. for 30 minutes, then ramped up to 300° C. at 2° C./min, held at 300° C. for 30 minutes, then removed from the oven and allowed to cool.

A first membrane layer 20, consisting of a first layer of gold and a second layer of titanium and denoted Au-Ti, is deposited on top of the cured polyimide layer 10 and in the bump-post sites and the bridge post sites. The purpose of this Au-Ti layer is to provide plating contact for the gold-plated bump-posts and gold-plated bridges (discussed below).

This membrane layer 20 is deposited by conventional sputtering processes. The gold layer is formed to a thickness of about 1,000 to 2,000 Å, and preferably to a thickness of about 1,000 Å, and the titanium layer is formed to a thickness of about 200 to 500 Å, and preferably to a thickness of about 200 Å. For the sake of clarity, the Au-Ti membrane layer 20 is denoted in the Figures as a single layer, although it will be understood to include two layers.

Figure 2:
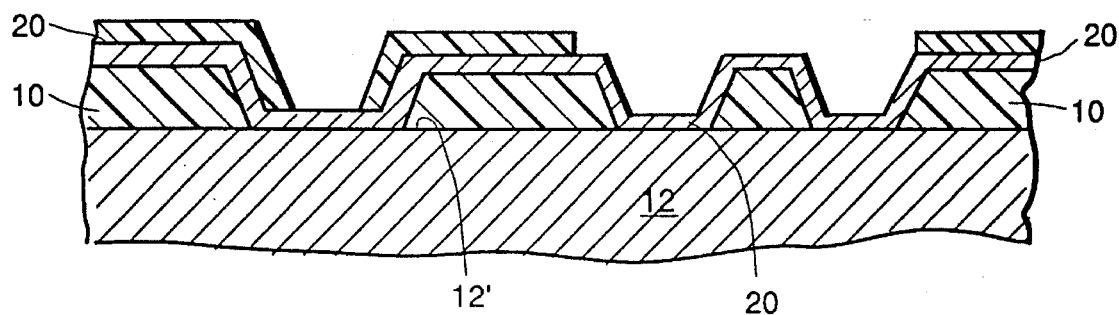

A second photoresist layer 22 is now formed on top of the first Au-Ti membrane layer 20 and is patterned and developed. This second photoresist layer 22, called the bridge photoresist layer, is for forming the gold-plated bump-posts and the gold-plated bridges, and is spun to a thickness ranging from about 3 to 4 μm, or about the thickness of the gold-plated bridges. The structure of the device at this stage in the processing is depicted in FIG. 2.

Following patterning and developing photoresist layer 22 to expose portions of the underlying first Au-Ti membrane layer 20, gold-plated bump-posts 24 and gold-plated bridges 26 are formed. For example, the gold-plated bump-posts and bridges are formed by employing a low frequency, pulse-plating process, using a gold cyanide plating solution.

Figure 3:
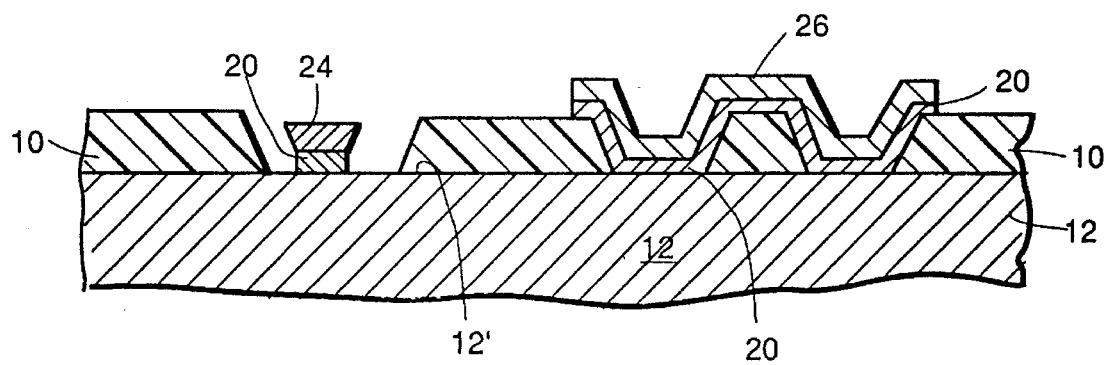

The bridge photoresist layer 22 is now removed and those portions of the underlying Au-Ti membrane layer 20 exposed by the removed photoresist are also removed. Etching away the exposed Au-Ti membrane is accomplished, for example, by chemical etching. As an example, titanium is removed by etching in a dilute HF solution, while gold is removed by etching in a KI solution. The structure of the device at this stage in the processing is depicted in FIG. 3.

Also in accordance with the invention, a second polyimide layer 28 is now formed and blanket-coated everywhere, followed by formation of a third photoresist layer 30 thereover. The third photoresist layer 30, called the bump-post photoresist layer, is formed to a thickness of about 3 to 4 μm, or thick enough to withstand the polyimide development process.

The coating of the polyimide layer 28 is accomplished as above, and is done to a thickness of about 4 to 6 μm. Since the surface is not planarized at this stage, this thickness is required to ensure total coverage of the surface morphology. However, the thickness of this layer 28 should not be so thick as to appreciably slow down subsequent processing (e.g., etching through this layer).

Figure 4:
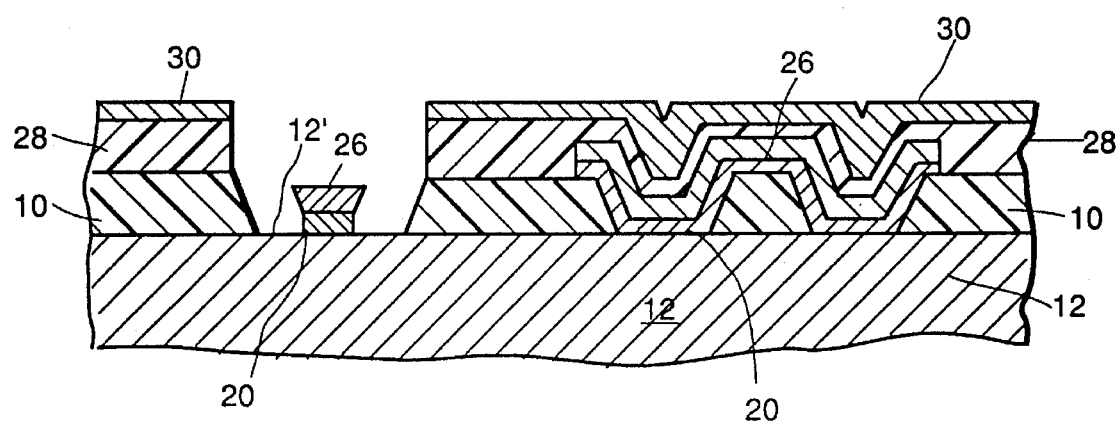

The third photoresist layer 30 and polyimide layer 28 are patterned to expose the gold-plated bump-posts 24, leaving the gold-plated bridges 26 covered. The structure of the device at this stage in the process is depicted in FIG. 4.

The bump-post photoresist layer 30 is removed by conventional methods. Next, the second polyimide layer 28 is fully cured, employing the same procedures used to cure the first polyimide layer 10.

Figure 5:
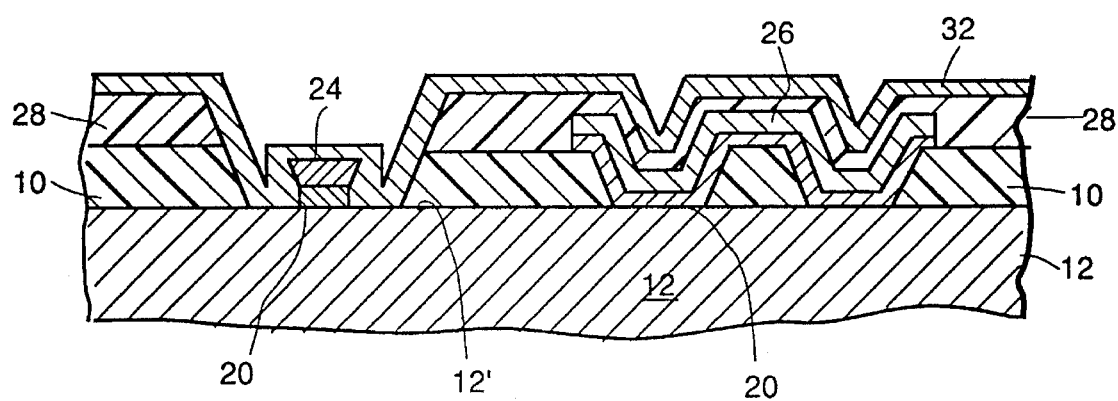

Also in accordance with the invention, a second membrane layer 32 of silver and titanium and denoted Ag-Ti is next blanket-deposited everywhere, also employing sputtering processes. Silver is deposited to a thickness ranging from about 1,000 to 2,000 Å, and preferably about 1,000 Å, and titanium is deposited to a thickness ranging from about 200 to 500 Å, and preferably about 500 Å. For the sake of clarity, the Ag-Ti membrane layer 32 is denoted in the Figures as a single layer, although it will be understood to include two layers. The structure of the device at this stage of the processing is depicted in FIG. 5.

Figure 6:
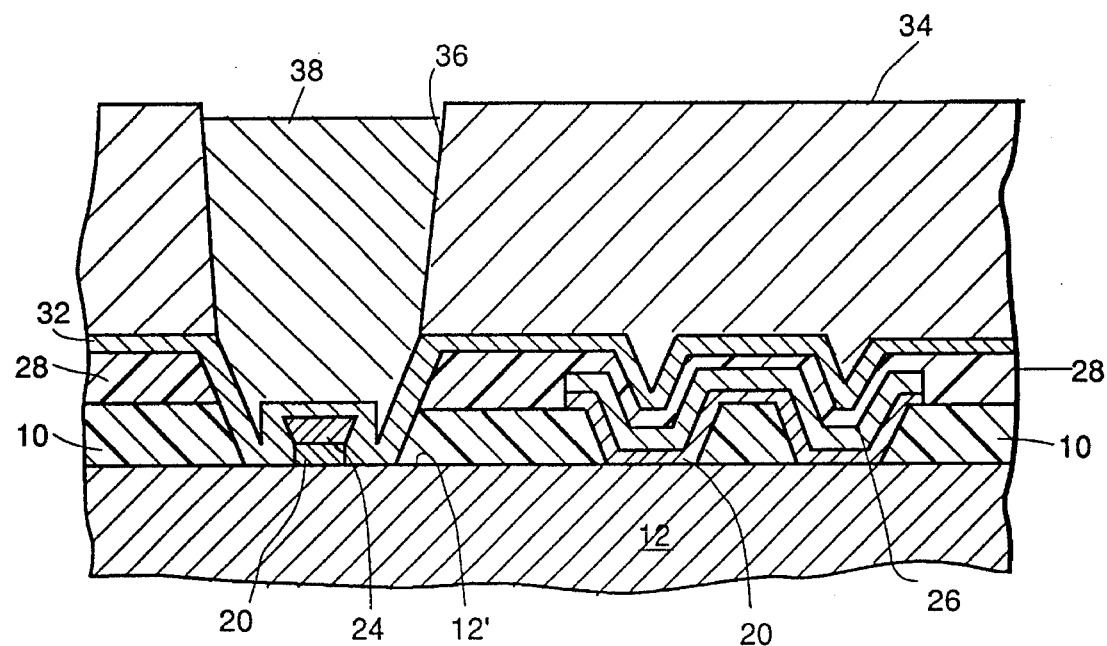

Now, a fourth photoresist layer 34 is formed on the second Ag-Ti membrane layer 32. This photoresist layer 34, called the bump photoresist layer, is applied to a thickness of about 75 to 85 µm, much thicker than the previous photoresist layers. The photoresist layer 34 is patterned and developed to expose the gold-plated bump-post 24 through openings 36, and silver-plated bump-posts 38 are now formed. The bump-posts 38 are formed by plating silver in the openings 36, employing a silver plating process, such as DC plating using silver cyanide plating solution. The structure of the device at this stage in the processing is depicted in FIG. 6.

Figure 7:
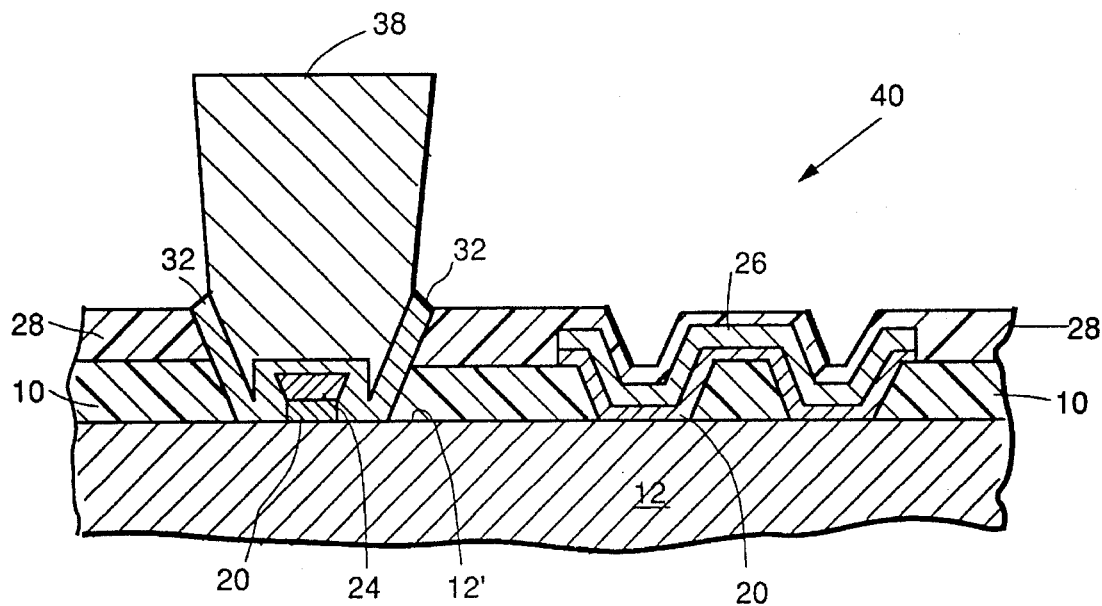

The bump photoresist 34 is removed, followed by removal of those portions of the second Ag-Ti membrane 32 thereby exposed, leaving the structure shown in FIG. 7. As can be seen, the top metal/GaAs substrate 12 has been completely passivated during the foregoing process, and remains passivated at the end of the process. Further, the gold-plated bridge 26 is supported by the first polyimide layer 10 and is passivated by the second polyimide layer 28. After separating individual MMIC chips by scribe and break technique, the passivated GaAs flip chip 40 is now ready for lead-tin reflow solder processing for mounting to the metallized ceramic substrate (not shown).

It will be appreciated that in addition to passivating the GaAs surface 12' (and any other circuit features thereon), the first polyimide layer 10 provides support for the gold-plated bridges 26. The second polyimide layer 28 provides passivation of the gold-plated bridges 26. Finally, the Ag-Ti membrane layer 32 prevents scavenging of gold in the gold-plated bump-posts 24 by the Pb-Sn reflow solder mounting process used to bond the silver bumps 38 to the metallized ceramic substrate.

Thus, the use of two polyimide passivation layers over the GaAs substrate and the gold-plated bridges and a silver-titanium composite membrane layer beneath silver-plated bumps improves the process of fabricating GaAs flip chip MMIC devices. It will be readily apparent to one skilled in this art that various changes and modifications of an obvious nature may be made without departing from the spirit of the invention, and all such changes and modifications are considered to fall within the scope of the appended claims.

What is claimed is:

1. A process for forming three terminal, GaAs microwave monolithic integrated circuit flip chips suitable for mounting to a metallized ceramic substrate, comprising the steps of:

(a) providing said chips with completed devices thereon, including a patterned top metallization layer on a major surface of said chips;

(b) forming a first polyimide layer on said major surface and patterning said first polyimide layer to expose bump-post sites and bridge post sites on said major surface, wherein said first polyimide layer has a thickness of about 3 to 4 µm;

(c) forming a first membrane layer of gold-titanium on said first polyimide layer and in said bump-post sites and said bridge post sites, wherein in said first membrane layer of gold-titanium, gold ranges from about 1,000 to 2,000 Å in thickness and titanium ranges from about 200 to 500 Å in thickness;

(d) forming gold posts having a height of at least 75 µm and gold bridges in said bump-post sites and said bridge post sites, respectively;

(e) removing any portions of said first gold-titanium membrane not covered by said gold posts and said gold bridges;

(f) forming a second polyimide layer on said major surface and patterning said second polyimide layer to expose said gold posts, wherein said second polyimide layer has a thickness of about 4 to 6 µm;

(g) forming a second membrane layer of silver-titanium on said second polyimide layer and on said gold posts, wherein in said second membrane layer of silver-titanium, said silver ranges from about 1,000 to 2,000 Å in thickness and said titanium ranges from about 200 to 500 Å in thickness;

(h) patterning bump photoresist over said second polyimide layer to expose said gold posts;

(i) plating silver bumps on said gold posts; and (j) removing said bump photoresist and any portions of said second silver-titanium membrane layer not covered by said silver bumps, thereby providing final passivated flip chips wherein said first polyimide layer is formed such that it passivates said major surface, said second polyimide layer is formed such that it passivates said gold bridges, and said second membrane layer is formed such that it prevents scavenging of gold from said gold posts.

2. The process of claim 1 wherein said gold is about 1,000 Å and titanium is about 200 Å.

3. The process of claim 1 wherein said silver is about 1,000 Å and said titanium is about 500 Å.

4. The process of claim 1 wherein said first and said second polymeric films are selected from the group consisting of polyimides, polybenzyl methacrylate, polybutyl methacrylate, polybutyl styrene, polybutadiene, styrenes, polyamide resins, polyacrylics, polyacrylamides, polystyrenes, polyethylene, polyisoprene, polymethyl pentenes, polymethyl methacrylates, and polyvinyls.

5. The process of claim 4 wherein said first and said second polymeric films consist essentially of a polyimide.

* * * * *